(12) United States Patent
Jang et al.

(10) Patent No.: US 6,982,187 B2
(45) Date of Patent: Jan. 3, 2006

(54) METHODS OF MAKING SHALLOW TRENCH-TYPE PIXELS FOR CMOS IMAGE SENSORS

(75) Inventors: Hoon Jang, Cheongju-si (KR); Keun Hyuk Lim, Seoul (KR)

(73) Assignee: DongbuAnam Semiconductor, Inc., Seoul (KR)

(*) Notice: Subject to any disclaimer, the term of this patent is extended or adjusted under 35 U.S.C. 154(b) by 0 days.

(21) Appl. No.: 10/606,693

(22) Filed: Jun. 26, 2003

(65) Prior Publication Data

US 2004/0043530 A1    Mar. 4, 2004

(30) Foreign Application Priority Data

Jun. 27, 2002  (KR)  .................. 10-2002-0036334

(51) Int. Cl.
*H01L 21/00* (2006.01)
*H01L 21/8238* (2006.01)

(52) U.S. Cl. ........................................ 438/75; 438/199

(58) Field of Classification Search ............... 438/48, 438/57, 73, 80, 197, 524, 525, 60, 75, 142, 438/199–201, 230, 232, 275, 303, 304–306, 438/526, 595, FOR 187, FOR 213; 257/E27.133, 257/E27.046, E27.108

See application file for complete search history.

(56) References Cited

U.S. PATENT DOCUMENTS

| | | | |
|---|---|---|---|
| 4,536,946 A * | 8/1985 | Nishizawa et al. | 438/57 |
| 6,177,333 B1 | 1/2001 | Rhodes | 438/433 |
| 6,329,233 B1 * | 12/2001 | Pan et al. | 438/199 |
| 6,372,603 B1 * | 4/2002 | Yaung et al. | 438/424 |
| 6,500,692 B1 | 12/2002 | Rhodes | 438/73 |

\* cited by examiner

*Primary Examiner*—Brook Kebede
(74) *Attorney, Agent, or Firm*—Hanley, Flight & Zimmerman, LLC

(57) ABSTRACT

A method of making a shallow trench-type pixel for a CMOS image sensor is disclosed. The disclosed pixel-fabricating method can increase the active area of a pixel by forming a photodiode in the shape of a shallow trench. In one example, a disclosed method includes forming a CMOS image sensor on an epitaxial wafer, forming a first photoresist layer over said structure, patterning so as to form a shallow trench on a pixel area, and, then, etching, removing said first photoresist layer, forming a second photoresist layer over said structure, pattering so as to form a photodiode junction, and, then, conducting ion-implanting process; and removing said second photoresist layer and conducting a thermal treatment process.

6 Claims, 10 Drawing Sheets

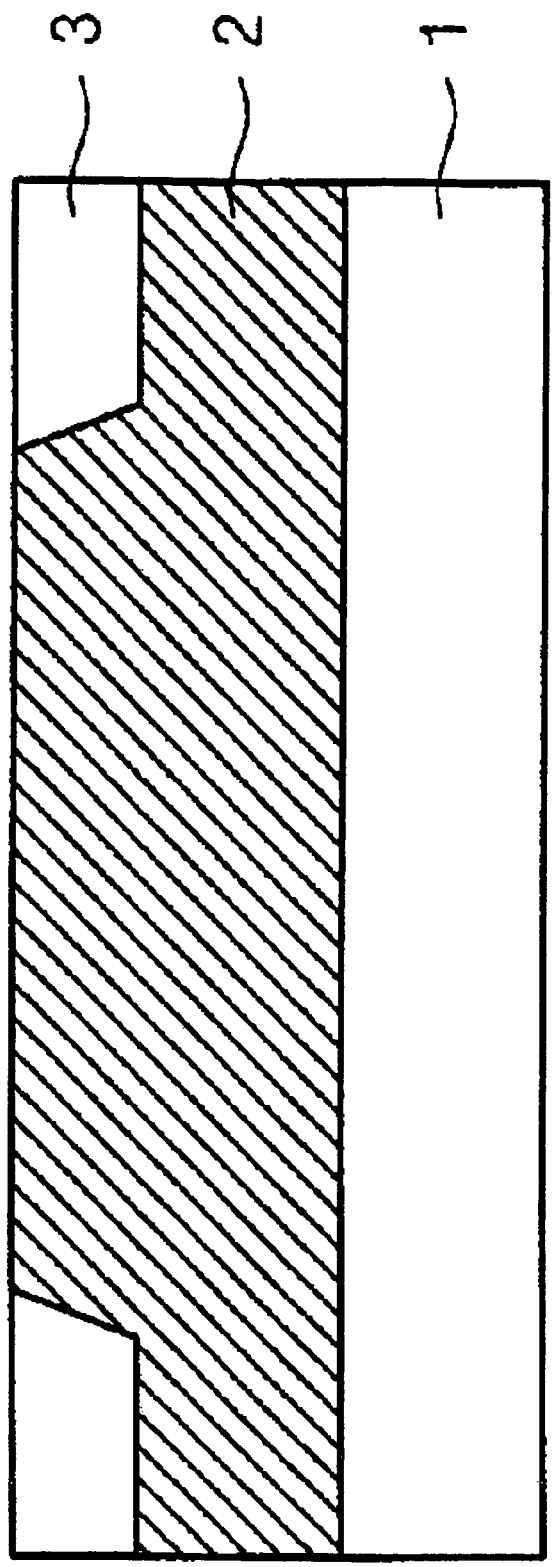
Fig. 1a --PRIOR ART--

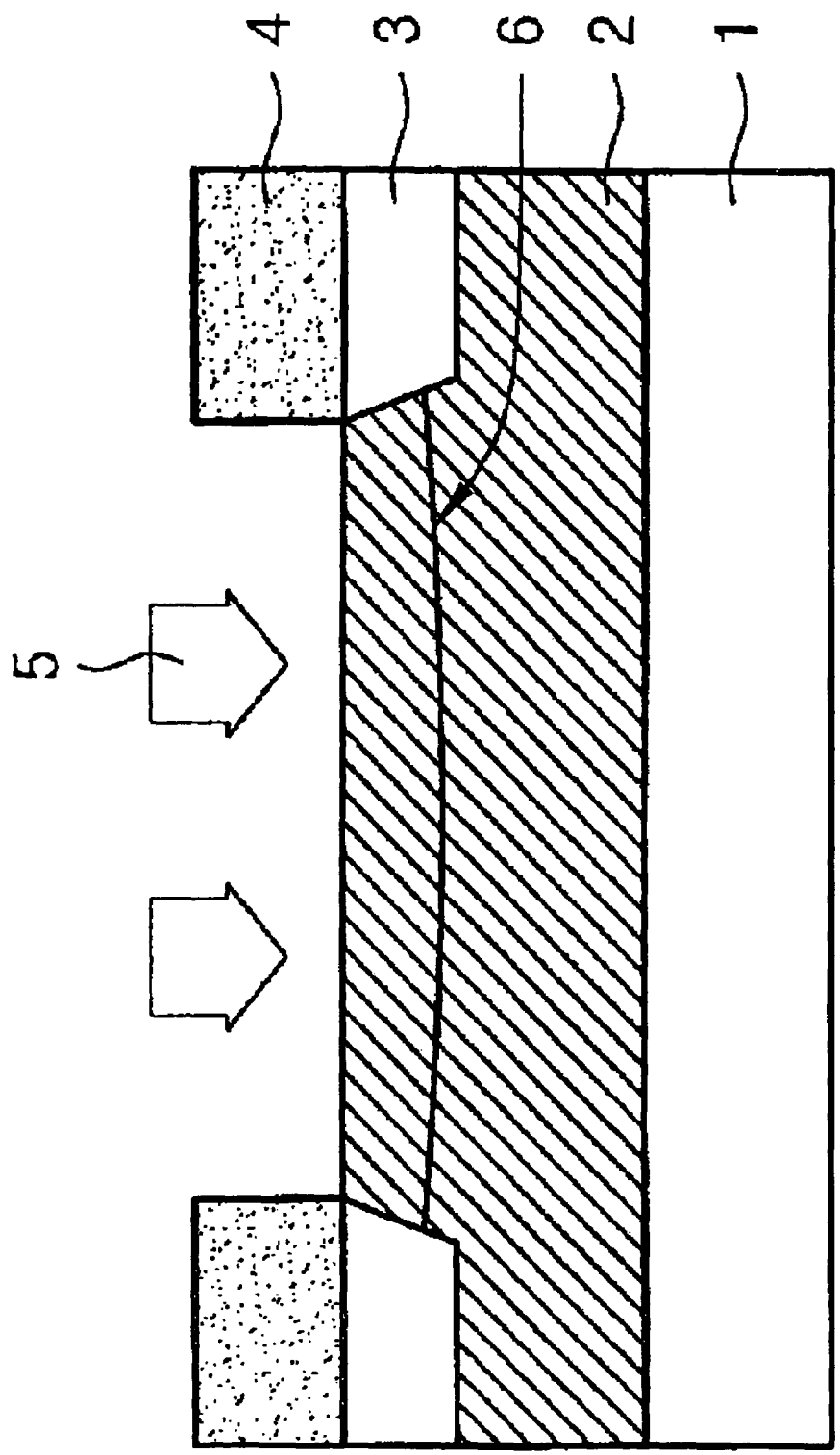
Fig. 1b --PRIOR ART--

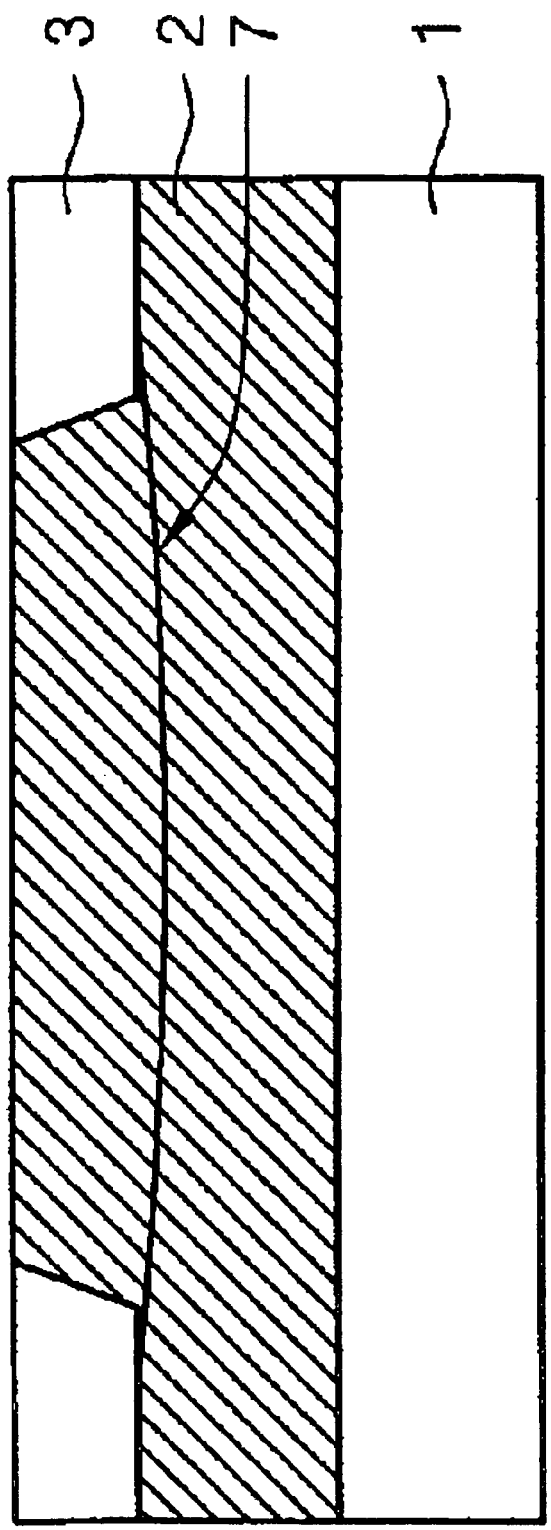
Fig.1c --PRIOR ART--

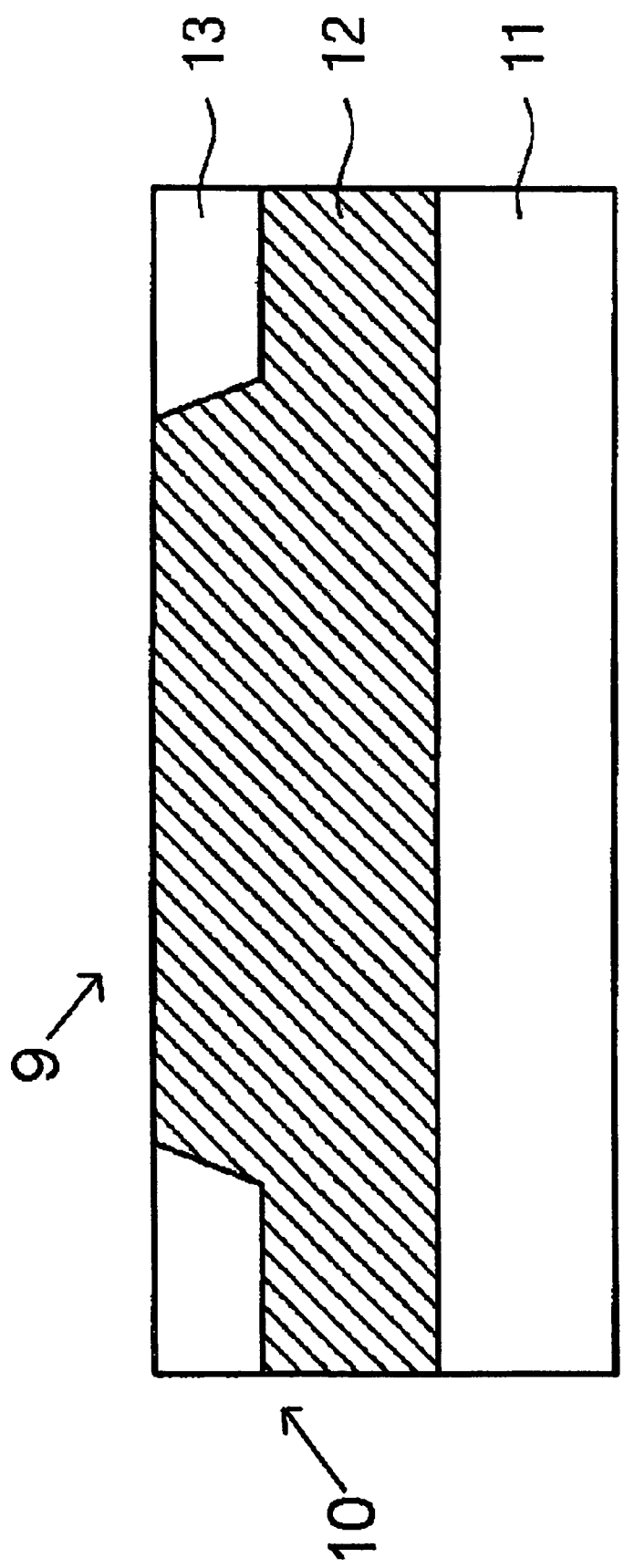
Fig.2a --PRIOR ART--

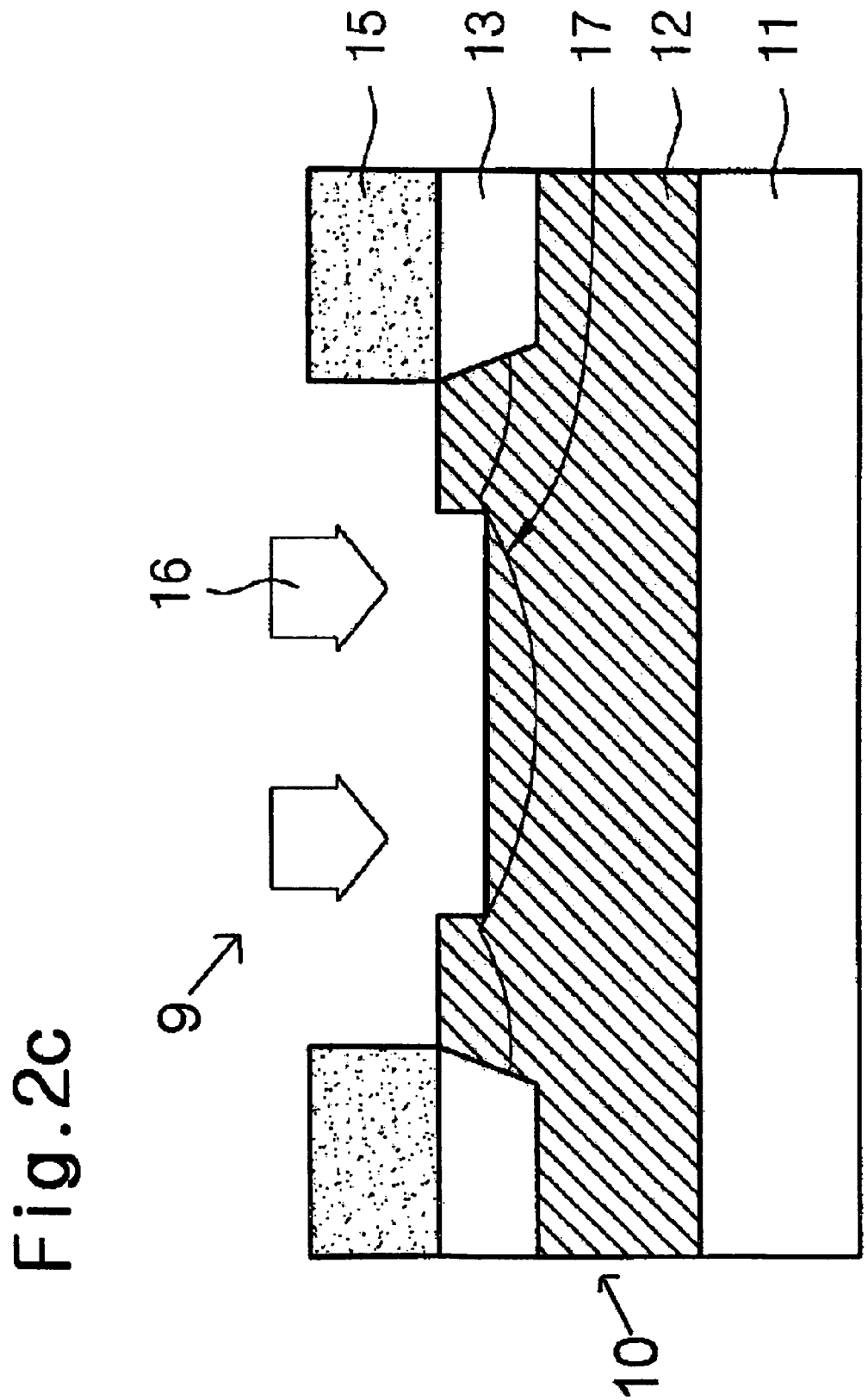

METHODS OF MAKING SHALLOW TRENCH-TYPE PIXELS FOR CMOS IMAGE SENSORS

TECHNICAL FIELD

The present disclosure relates to complimentary metal-oxide semiconductors (CMOS) and, more particularly, to methods of making shallow trench-type pixels for CMOS image sensors.

BACKGROUND

In a CMOS image sensor, a pixel detects an image by accepting light rays in an area on which a photodiode is formed. A photodiode is a device that produces electrical signals by generating electron hole pairs (hereinafter referred to as "EHPs") by means of incident light rays through a p-n junction.

At present, a commercialized process technology uses 0.35 micron ($\mu$m)~0.50 $\mu$m technology, where a pixel size is 7~8 $\mu$m. In case of two-dimensional pixel architecture, in a process technology of 0.25 $\mu$m, the physical limit of pixel size is about 4 $\mu$m×4 $\mu$m.

However, there is a technical problem in case of systems on chip (hereinafter referred to as "SoC"). In particular, SoC use a process technology of less than 0.25 $\mu$m to integrate many constituents on a single chip. Accordingly, the pixel size of a CMOS sensor must be reduced and the number of EHPs produced must remain at the existing level so that the sensor can separate image signals from noise and parasitic components.

A shallow trench isolation (hereinafter referred to as "STI") is one technique that can be used to isolate devices such as memory cells or pixels from one another. However, STI methods may cause a dark current due to defect centers by etch damages around edges. To eliminate this disadvantage, the photodiode region is generally doped deeply by an ion-implanting process so as to cover the STI. However, in that case there is a problem in that signals with short wavelengths near blue region in visible rays get buried.

FIGS. 1a to 1c are cross sectional views illustrating a process of forming a pixel for a CMOS image sensor according to the prior art. Referring to FIG. 1a, a CMOS image sensor is formed on an epitaxial wafer having a structure of an epitaxial layer 2 doped with a low concentration positioned on a p-type substrate 1 doped with a high concentration. Active areas are isolated from one another by STI layers 3.

Next, referring to FIG. 1b, after patterning a photoresist layer 4 on the active area formed, an ion implantation process is conducted in order to form a photodiode p-n junction. There is a profile 6 doped in the epitaxial layer 2 doped with a low concentration.

Then, referring to FIG. 1c, the photoresist layer 4 is removed, and an annealing process is performed. A final profile 7 doped in the epitaxial layer 2 forms a junction under the STI layer 3 to reduce a recombination current generated at the STI edge.

As mentioned above, the existing method for making a pixel for a CMOS image sensor has to make a deep photodiode junction because of a recombination current problem due to defects and damages of STI edges. However, in that case, the signals of blue wavelength appear near the surface. In addition, in a two-dimensional structure the active area and pixel size are the same, and, therefore, a degree of integration is reduced.

BRIEF DESCRIPTION OF THE DRAWINGS

FIGS. 1a through 1c illustrate, in cross-sectional views, the process steps according to a prior art pixel-fabricating method.

FIGS. 2a through 2d illustrate, in cross sectional views, the process steps according to the disclosed pixel-fabricating methods.

DETAILED DESCRIPTION

Figure 2B:
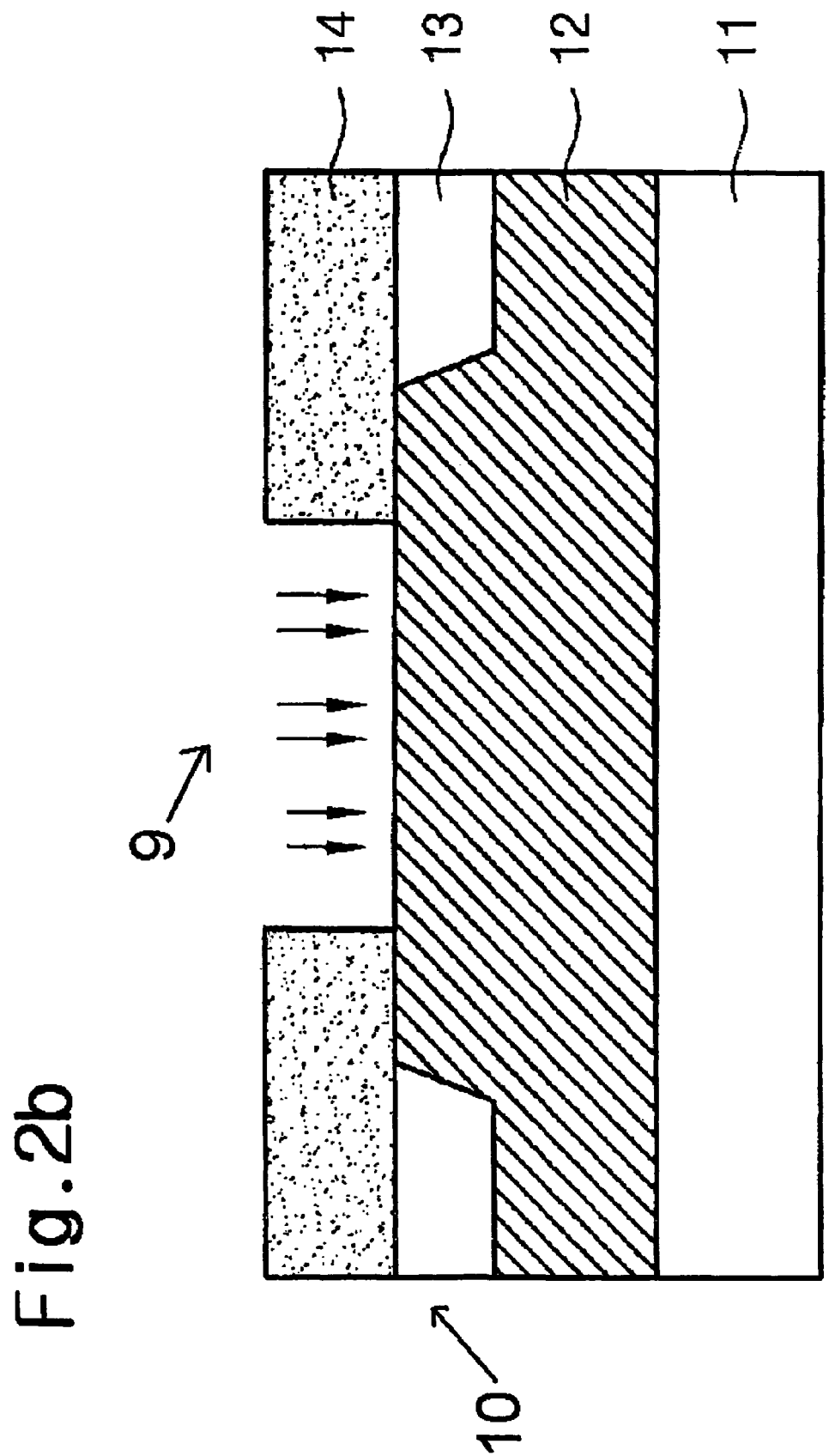

Referring to FIG. 2a, a CMOS image sensor 9 is formed on an epitaxial wafer 10 having a structure formed by an epitaxial layer 12 doped with a low concentration and positioned on a p-type or n-type substrate 11 doped with a high concentration. An active area is isolated from other active areas by an STI layer 13.

Referring to FIG. 2b, a photoresist layer 14 is coated over the structure of FIG. 2a. Then, a patterning process is conducted to form a shallow trench, and the epitaxial layer 12 is etched. The shallow trench may have a depth between about 10 angstroms (Å) and about 10,000 Å. The shallow trench may be filled with dielectrics such as oxide, nitride, oxinitride, and silicate glass by spin coating, chemical vapor deposition (CVD), or diffusion method.

Next, referring to FIG. 2c, a photoresist layer 15 is coated over the structure of FIG. 2b. Then, a patterning process is conducted to form a photodiode junction in the pixel area formed, and an ion-implanting 16 is performed. Reference number 17 is a profile doped in the epitaxial layer 12 doped with a low concentration.

Figure 2D:
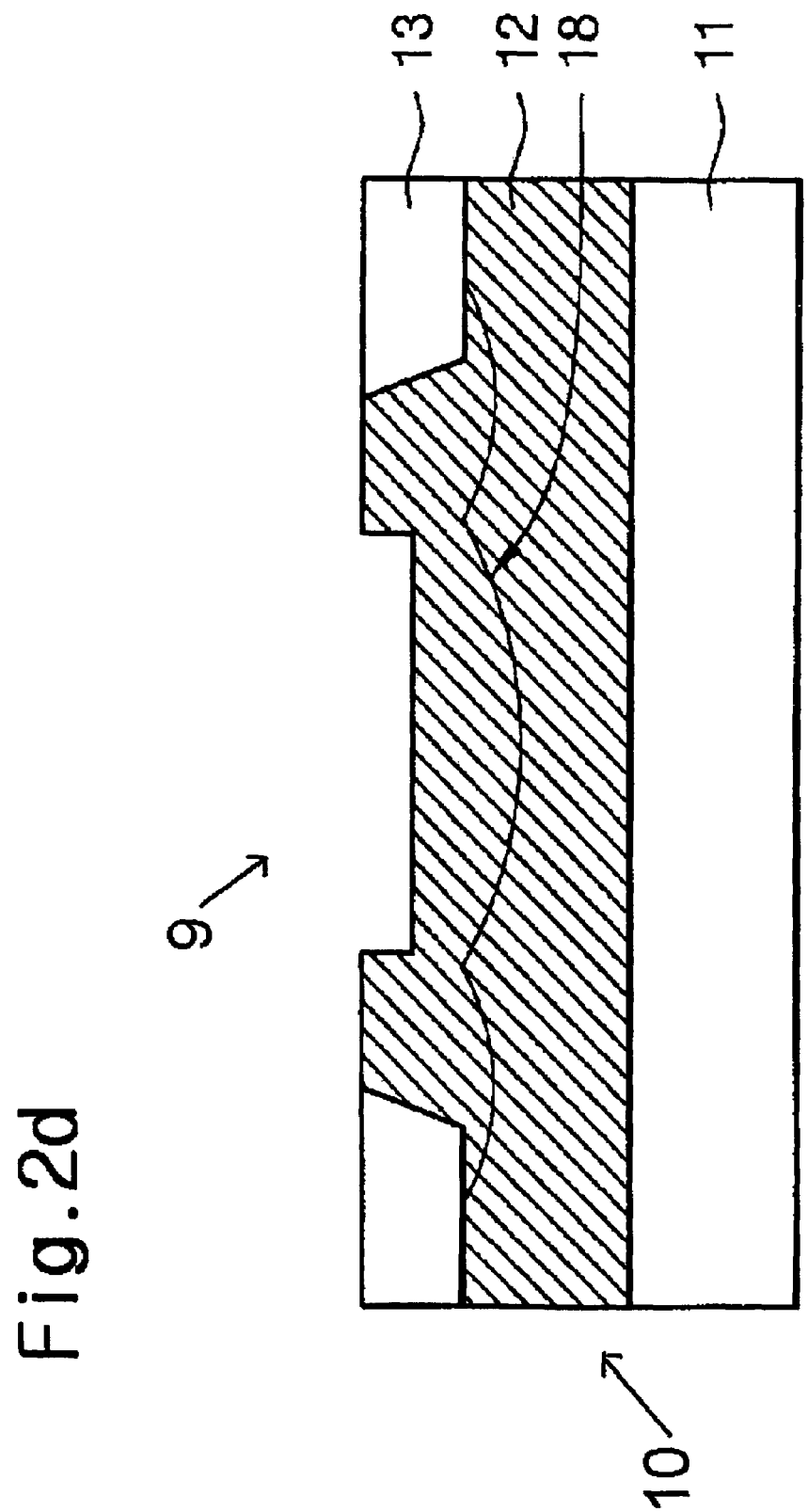

Referring to FIG. 2d, the photoresist layer 15 is removed and an annealing process is performed. A final profile 18 doped in the epitaxial layer 12 is formed through the annealing process. The annealing is performed by the rapid thermal annealing (hereinafter referred to as "RTA") or furnace annealing in the temperature range of 50~400 degree Centigrade (C).

Figure 3:
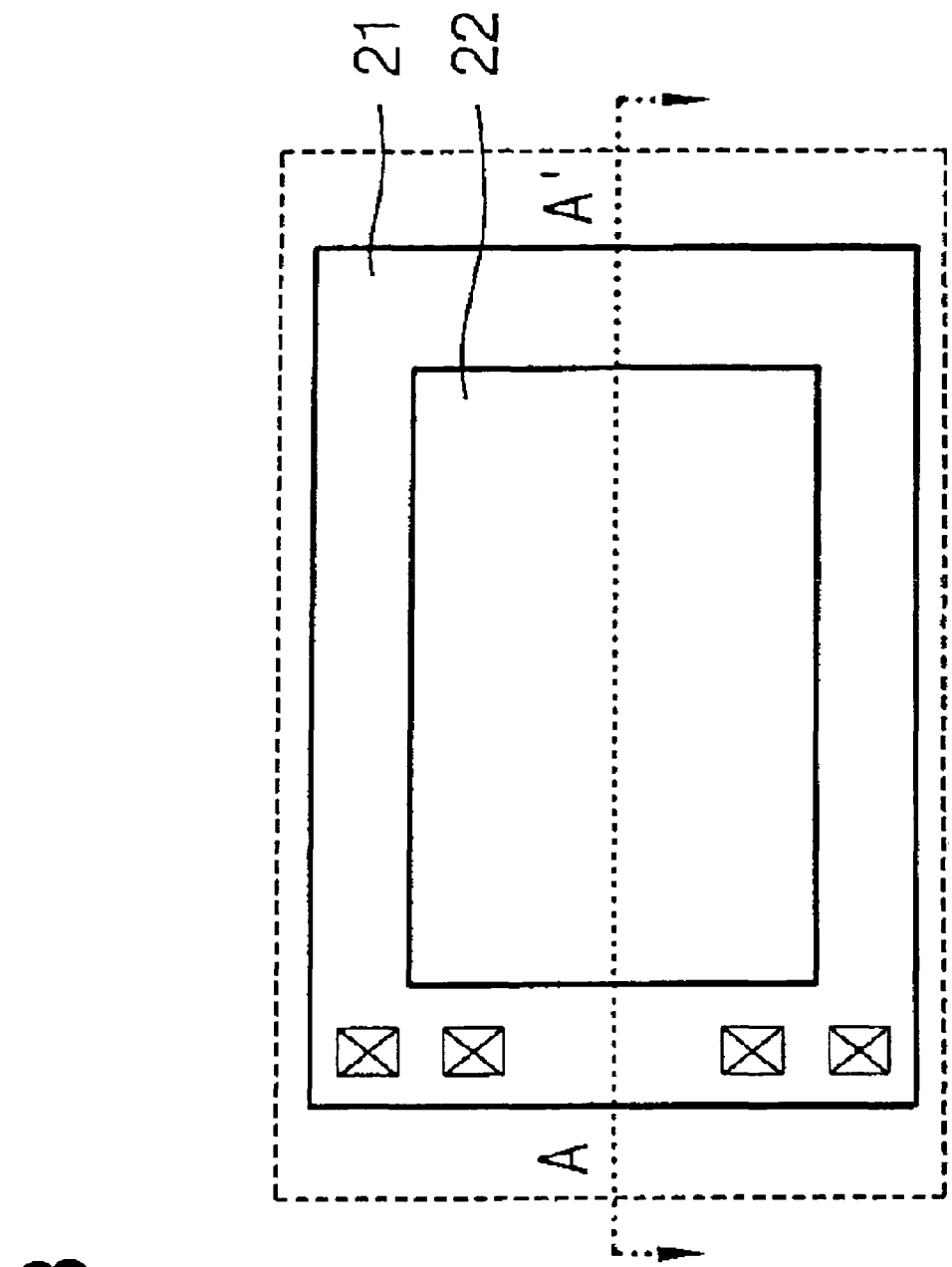
FIG. 3 is a layout of a pixel according to the disclosure.

FIG. 3 is a layout of a pixel according to the disclosed examples. A pixel 21 and a shallow trench 22 have been formed in an active area.

Figure 4:
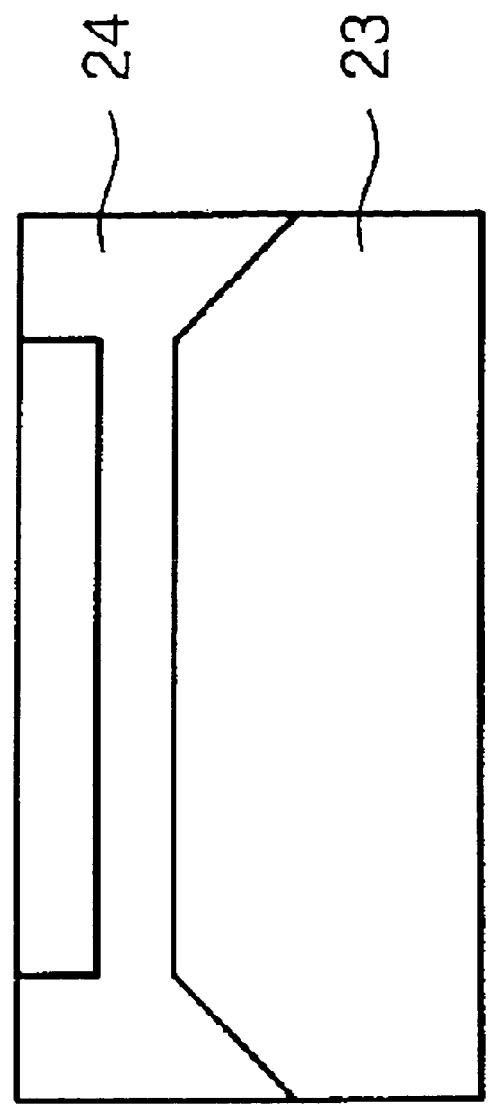
FIG. 4 is a cross-sectional view of FIG. 3 taken along lines A–A'.

FIG. 4 is a cross-sectional view of FIG. 3 taken along lines A–A'. The reference number 23 is an epitaxial layer playing a role of a substrate, and reference number 24 is a doping profile of a photodiode.

Figure 5:
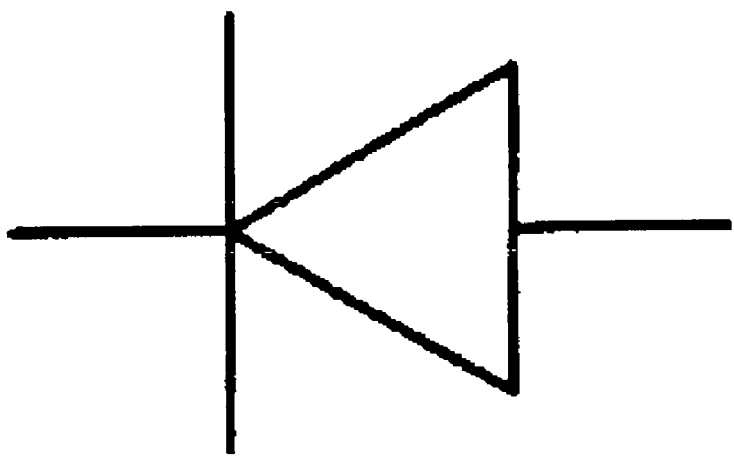
FIG. 5 is an equivalent circuit of a photodiode.

FIG. 5 is an equivalent circuit of a photodiode. The disclosed methods can be applied to multi-transistor image sensor structures as well as a one-transistor image sensor structure.

Thus, the method for making of shallow trench type pixel for CMOS image sensor according to the disclosed examples can compensate reduction in the active area of a pixel using the area of the lateral wall of a shallow trench formed by etching the pixel area, although the design size of a pixel is reduced. Moreover, in an ion-implanting process to form a photodiode, the doping profile around the edge of the shallow trench is formed deeply toward the lateral wall of the STI layer, thereby having an effect of a reduction of recombination current.

The foregoing disclosure is merely for example purposes and are not to be construed as limiting. The present teachings can be readily applied to other types of apparatuses. The disclosure is intended to be illustrative, and not to limit the scope of the claims. Many alternatives, modifications, and variations will be apparent to those having ordinary skill in the art.

The foregoing disclosed methods for making a shallow trench type pixel for a CMOS image sensor substantially obviate one or more problems due to limitations and disadvantages of the related art. The disclosed methods include making a shallow trench type pixel, which can secure a minimum number of photoelectrons for processing video signals by increasing the active area of a pixel through forming a photodiode in the shape of a shallow trench in order to solve the problems due to a reduction in the number of photoelectrons according to a pixel shrinkage in a deep submicron level, i.e., a less than 0.25 $\mu$m technology for a CMOS image sensor.

What is claimed is:

1. A method for making shallow trench type pixel for complimentary metal oxide semiconductor (CMOS) image sensor, comprising: forming a CMOS image sensor on an epitaxial wafer having a structure including an epitaxial layer doped with a low dopant concentration positioned on a p-type or n-type substrate doped with a high concentration; forming a first photoresist layer over said structure, patterning the first photoresist layer, and etching the epitaxial layer so as to form a shallow trench on a pixel area defined by trench isolation structures; removing said first photoresist layer; forming a second photoresist pattern coexistive with said trench isolation structures so as to form a photodiode junction in at least a portion of the shallow trench of the pixel area, and, then, conducting ion-implanting process; and removing said second photoresist pattern and conducting a thermal treatment process.

2. A method as defined by claim 1, wherein said first and second photoresist layers are removed by an ashing process.

3. A method as defined by claim 1, wherein said thermal treatment is performed by rapid thermal annealing (RTA) or furnace annealing in the temperature range of 50~400 degree Centigrade.

4. A method as defined by claim 1, wherein a final profile doped in said epitaxial layer doped with a low dopant concentration is formed on the top of a shallow trench isolation layer.

5. A method as defined by claim 1, wherein the shallow trench has a depth of 10~10000 angstroms.

6. A method as defined by claim 1, wherein the shallow trench is filled with a dielectric selected from the group consisting of oxide, nitride, oxinitride, and silicate glass by spin coating, chemical vapor deposition (CVD), or diffusion methods.

* * * * *